US008127257B2

(12) United States Patent
Kawakami

(10) Patent No.: US 8,127,257 B2
(45) Date of Patent: Feb. 28, 2012

(54) DESIGNING METHOD OF PHOTO-MASK AND METHOD OF MANUFACTURING SEMICONDUCTOR DEVICE USING THE PHOTO-MASK

(75) Inventor: Yukiya Kawakami, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 408 days.

(21) Appl. No.: 12/379,705

(22) Filed: Feb. 26, 2009

(65) Prior Publication Data

US 2009/0233187 A1 Sep. 17, 2009

(30) Foreign Application Priority Data

Mar. 3, 2008 (JP) ................. 2008-052031

(51) Int. Cl.
*G06F 17/50* (2006.01)
*G03F 1/00* (2006.01)
*G03F 7/00* (2006.01)

(52) U.S. Cl. ............... 716/53; 716/50; 716/51; 716/52; 716/54; 716/55; 430/5; 430/311

(58) Field of Classification Search .............. 716/50–55; 430/5, 311

See application file for complete search history.

(56) References Cited

U.S. PATENT DOCUMENTS

| | | | |
|---|---|---|---|
| 6,301,697 B1 | 10/2001 | Cobb | |
| 6,303,253 B1* | 10/2001 | Lu | 430/5 |
| 6,753,115 B2* | 6/2004 | Zhang et al. | 430/5 |
| 6,952,818 B2* | 10/2005 | Ikeuchi | 430/311 |
| 7,480,890 B2* | 1/2009 | Hsiao | 716/53 |
| 7,614,033 B2* | 11/2009 | Pierrat et al. | 716/50 |
| 7,761,839 B2* | 7/2010 | Gallatin et al. | 716/53 |
| 2007/0028205 A1* | 2/2007 | Nakano et al. | 716/19 |
| 2007/0074142 A1* | 3/2007 | Smayling et al. | 716/21 |
| 2008/0070414 A1* | 3/2008 | Shiraishi | 438/702 |
| 2010/0167184 A1* | 7/2010 | Wong et al. | 430/5 |

FOREIGN PATENT DOCUMENTS

| | | |
|---|---|---|
| JP | 2001-281836 A | 10/2001 |
| JP | 3343246 B1 | 11/2002 |
| JP | 2005-84280 A | 3/2005 |

* cited by examiner

*Primary Examiner* — Helen Rossoshek
(74) *Attorney, Agent, or Firm* — McGinn IP Law Group, PLLC

(57) ABSTRACT

In a method of designing a photo-mask, a graphic pattern as a target of development simulation is divided into a plurality of sub graphic patterns which are respectively assigned with a plurality of orthogonal coordinate systems which are not orthogonal to each other. A model-based OPC (optical proximity correction) is performed on each of the plurality of sub graphic patterns by moving sides of the sub graphic pattern in directions parallel to coordinate axes of the orthogonal coordinate system assigned to the sub graphic pattern.

20 Claims, 4 Drawing Sheets

Fig. 4
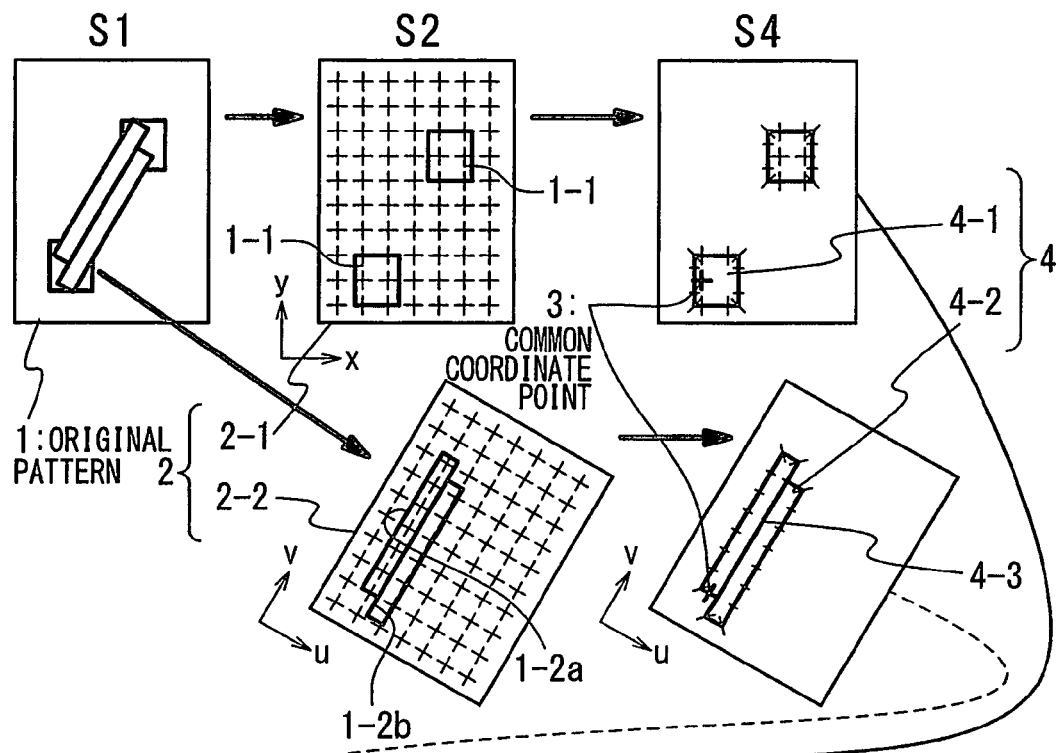
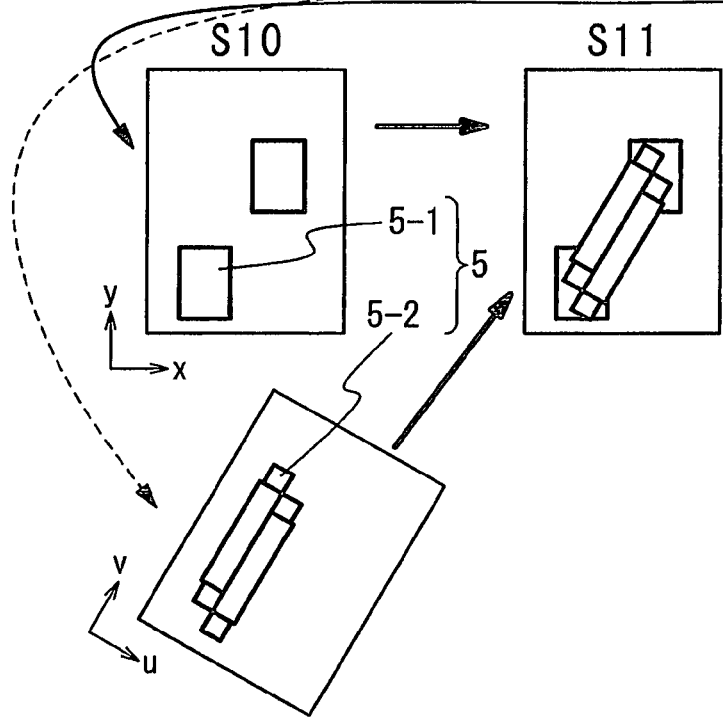

DESIGNING METHOD OF PHOTO-MASK AND METHOD OF MANUFACTURING SEMICONDUCTOR DEVICE USING THE PHOTO-MASK

INCORPORATION BY REFERENCE

This patent application claims priority on convention based on Japanese Patent Application No. 2008-052031. The disclosure thereof is incorporated herein by reference.

BACKGROUND OF THE INVENTION

1. Field of the Invention

The present invention relates to optical proximity correction upon manufacturing of a semiconductor device.

2. Description of Related Art

Advances of semiconductor manufacturing technique in recent years have allowed semiconductors having a minimum fabrication size of 50 nm or less to be manufactured. Such miniaturization has become possible because of advances in fine patterning techniques such as a mask process technique, a photolithography technique, and an etching technique. When an exposure apparatus used an i-line or a g-line, and a pattern size was sufficiently larger than the wavelength of exposure light, a pattern almost faithful to an original LSI pattern could be formed on a wafer by directly transferring on a mask, the LSI pattern to be formed on the wafer by use of electron beam lithography, further transferring a mask pattern on a wafer by a projection optical system, and etching the wafer.

However, along with the pattern miniaturization, it has been difficult to faithfully transfer/form a pattern in each process. Therefore, there arises a problem that an original critical dimension (CD) of an LSI pattern cannot be reproduced as a final critical dimension (CD). In particular, in lithography and etching processes that are most important for finer fabrication, a dimensional accuracy (CD accuracy) of a desired pattern is largely influenced by a layout of other patterns arranged around the desired pattern to be formed.

Therefore, in order to suppress such variation, an optical proximity correction (OPC) technique has been employed in which edge and corner portions of the mask pattern where the variation is significant are preliminarily deformed such that a dimension after fabrication takes a desired value. In this technique, a pattern after development reproduces the original pattern by fundamentally dissecting sides of an original pattern, and minutely moving the dissected sides. Specifically, in Japanese patent No. 3,343,246, an original pattern is dissected, two apexes are inserted in each dissected portion, and a line segment is generated between the two apexes. Thus, the dissected sides are moved without generating a line segment not connected to another line segment. An amount of the movement is determined on the basis of a table called a lookup table in a rule-based OPC, whereas it is recursively determined on the basis of a development (or optical) simulation, i.e., on the basis of trial and error, in a model-based OPC.

In the conventional model-based OPC, all patterns on a plane are decomposed into rectangles having horizontal and vertical sides. If there is no oblique side component, the conventional model-based OPC is well applicable. In the model-based OPC, a movement direction of one side to be moved for correction is characterized by being perpendicular to a direction of the line segment of the side. That is, a pattern to be corrected is set in an orthogonal coordinate system having x- and y-axes, and if the line segment of the side is parallel to the x-axis, the movement direction is parallel to the y-axis, whereas if the line segment of the side is parallel to the y-axis, the movement direction is parallel to the x-axis. Accordingly, if the pattern includes sides parallel to any of the coordinate axes of the orthogonal coordinate system, it is easy to linearly predict and correct a shift amount of the side between a desired position and a calculated position.

Specifically, it is assumed that a mask error enhancement factor (MEEF) is denoted by A, a line segment in the y direction is positioned at x0, and a development position of the side is shifted to X0. When the original side is varied in position as x0±dx, the development position can be predicted as X0±dx×A by linear prediction. When a graphic pattern is complicated, a value of A is unknown. However, if this linearity is used and it is supposed that x1=x0+dx0 and a corresponding development position is X1=X0+dx0×A, A=(X1−X0)/dx0=(X1−X0)/(x1−x0). It can be estimated that dx1 meeting x0=X0+dx1×A is dx1=(x0−X0)×(x1−x0)/(X1−X0).

However, a problem arises when an oblique graphic pattern having oblique sides is present. Considering an LSI circuit layout to be produced, an oblique line often achieves the shortest distance, and if this oblique line is allowed, design is facilitated. In this case, two problems arise in OPC calculations.

A first problem is in that a direction of the oblique side of the oblique graphic pattern and a movement direction of it are not orthogonal to each other, so that a correction amount is different for each side, resulting in difficulty in the linear prediction. In conjunction with this problem, a technique described in Japanese Patent Application Publication (JP-P2005-84280A) is related to the rule-based OPC, and the oblique graphic pattern and horizontal/vertical graphic patterns are distinguished from each other, and a movement amount of a side is changed for each of the graphic patterns. This means that even if the rule-based OPC is replaced by the model-based OPC without modification, a correction amount should be different between the oblique graphic pattern and the horizontal/vertical graphic patterns. In such a method, a defect of an abnormal pattern may be generated upon production of a mask, depending on a condition.

Also, a technique related to the oblique pattern correction of the rule-based OPC is described in Japanese Patent Application Publication (JP-P2001-281836A). In this technique, an oblique graphic pattern is once rotated such that sides thereof are horizontally/vertically directed, and subjected to the same rule-based OPC as in case of correction of horizontal/vertical graphic pattern, and then the corrected graphic pattern is reversely rotated to have an original oblique side. However, if this is applied to the model-based OPC in which the trial-and-error is repeated, the rotation and the reverse rotation are repeated many times, and therefore calculation is time-consuming.

A second problem is in that an oblique line necessarily intersects with a vertical or horizontal line somewhere, and these lines form an acute-angled portion. The optical proximity correction (OPC) is less effective to such an acute-angled portion, and therefore causes a reduction in throughput in electron beam lithography for producing a mask.

SUMMARY

Therefore, the present invention provides a method of designing a photo-mask in which calculation is easy and an oblique pattern can be process.

In an aspect of the present invention, a method of designing a photo-mask is achieved: by dividing a graphic pattern as a target of development simulation into a plurality of sub graphic patterns which are respectively assigned with a plurality of orthogonal coordinate systems which are not orthogonal to each other; and by performing a model-based OPC (optical proximity correction) on each of the plurality of sub graphic patterns by moving sides of the sub graphic pattern in directions parallel to coordinate axes of the orthogonal coordinate system assigned to the sub graphic pattern.

In another aspect of the present invention, a method of manufacturing a semiconductor device is achieved: by designing a photo-mask to produce a photo-mask data; by producing a photo-mask based on the photo-mask data; and by manufacturing a semiconductor device by using the photo-mask. Here, the designing step is achieved: by dividing a graphic pattern as a target of development simulation into a plurality of sub graphic patterns which are respectively assigned with a plurality of orthogonal coordinate systems which are not orthogonal to each other; and by performing a model-based OPC (optical proximity correction) on each of the plurality of sub graphic patterns by moving sides of the sub graphic pattern in directions parallel to coordinate axes of the orthogonal coordinate system assigned to the sub graphic pattern.

The present invention provides a photomask designing method in which high accuracy model-based OPC can be applied to a graphic pattern including an oblique graphic pattern.

BRIEF DESCRIPTION OF THE DRAWINGS

The above and other objects, advantages and features of the present invention will be more apparent from the following description of certain embodiments taken in conjunction with the accompanying drawings, in which:

FIG. 4 is a diagram showing the mask designing method in the third embodiment.

DESCRIPTION OF THE PREFERRED EMBODIMENTS

Hereinafter, the present invention will be described with reference to the attached drawings. It should be noted that, in all of the drawings, the same and similar components are assigned with the same and similar symbols, and description thereof is omitted as appropriate.

Operations are performed by a computer in the following description. The computer includes a processing section, an input unit, and an output unit, and a storage unit (all not shown). That is, software describing a design procedure to be described below, and design data subjected to the OPC are stored in the storage unit. The processing section reads and executes the software which is loaded in the storage unit from a recording medium, and outputs a result of the OPC on the design data to the output unit according to the following procedure.

First Embodiment

Figure 1:
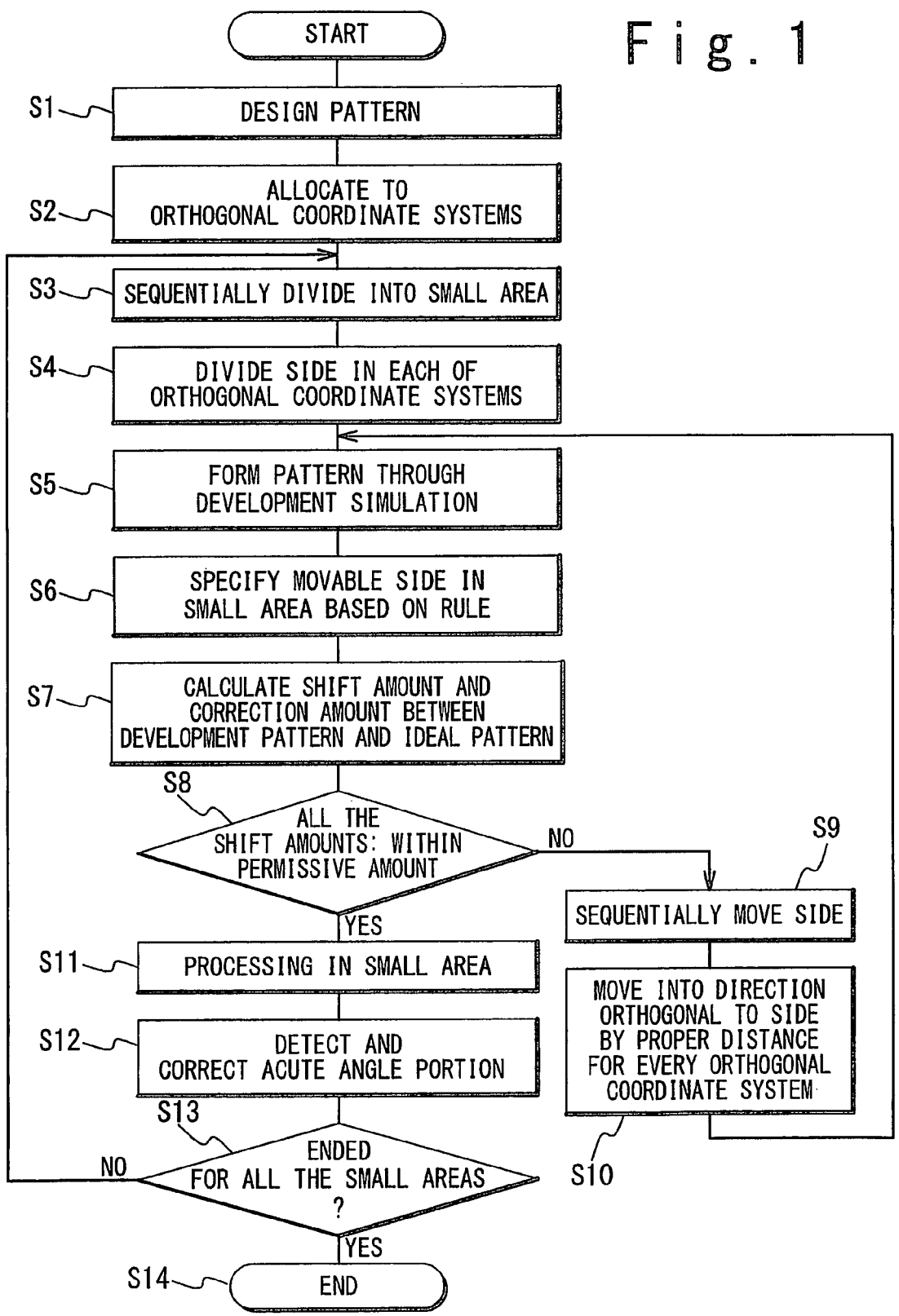
FIG. 1 is a flow chart showing a flow of a mask designing method according to first, second and third embodiments of the present invention.
Figure 2:
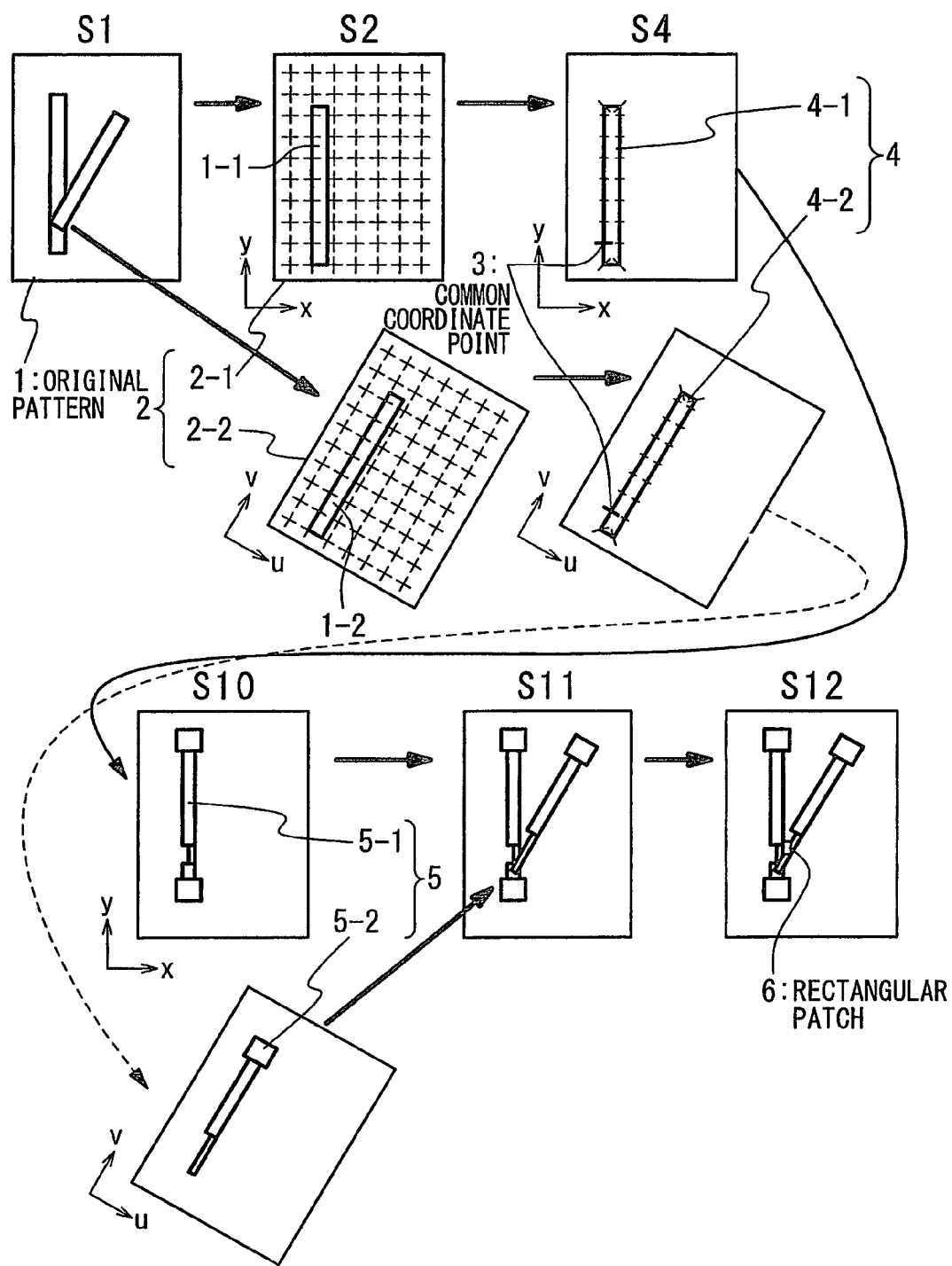
FIG. 2 is a diagram showing the mask designing method in the first embodiment.

FIG. 1 is a diagram illustrating a mask designing flow according to a first embodiment of the present invention. Specifically, FIG. 1 illustrates processing steps from preparation of a pattern design to an OPC pattern output. FIG. 2 is a diagram showing the mask designing method in the first embodiment.

First, after a circuit design, the pattern design is started (Step S1). It is assumed that an original pattern is arranged on a single layer and has partial graphic patterns 1-1 and 1-2. The layer is provided with a first two-dimensional orthogonal coordinate system (x, y). Then, each of sides of the partial graphic pattern 1-1 is parallel to the x-axis (vertical to the y-axis) or the y-axis (vertical to the x-axis) and the graphic pattern 1-1 is moved onto a first sub layer 2-1 allocated with the same orthogonal coordinate system as the first orthogonal coordinate system, and it is checked whether the an outer line of the line segments of the partial graphic pattern 1-1 is closed.

Subsequently, oblique lines of oblique sides of the partial graphic pattern 1-2 (oblique to the coordinate axes of the first orthogonal coordinate system) are determined in the original pattern 1 of the original layer and a direction of each oblique line and a coordinate (u1, v1) in a direction orthogonal to the direction of the oblique line are considered. Each of sides of the partial graphic pattern 1-2 is parallel to the u1 axis (perpendicular to the v1 axis) or the u1 axis (perpendicular to the v1 axis) and the partial graphic pattern 1-2 is moved onto a second sub layer 2-2. This operation is repeated for all the oblique sides. The original pattern 1 is divided into partial graphic patterns on orthogonal coordinate systems. It is supposed that n is an integer indicating a number given to the orthogonal coordinate systems. Each side of each of the partial graphic patterns is parallel to the $u_n$ axis (orthogonal to the $v_n$ axis) or the $v_n$ axis (orthogonal to the $u_n$ axis), and the partial graphic pattern is moved onto a $(n-1)^{th}$ sub layer. In this manner, the partial graphic patterns 1-1, 1-2 of the original pattern (sub graphic pattern) 1 are allocated to the plurality of orthogonal coordinate systems (Step S2). As a result, each of the plurality of partial graphic patterns is only formed of sides, each of which is parallel or orthogonal to coordinate axes of the orthogonal coordinate system provided to the sub layer to which the sub graphic pattern belongs.

Each of the partial graphic patterns in the plurality of orthogonal coordinate systems has a common origin, from which the orthogonal coordinate systems respectively for the partial graphic patterns are obtained, and therefore all of them can be accurately superposed in synthesis. In the above description, a partial graphic pattern is moved from the layer to a lower-level sub layer. However, the same is true even if the partial graphic pattern is moved from the layer to the layer of the same level.

Subsequently, in order to perform the OPC, a small region ((x, y) coordinates) on which a development simulation is performed is determined to start preparation for performing the OPC (Step S3). A size of the small region is called Ambit or the like, and depends on a design rule. For example, according to a 90 nm rule, it is a square-patterned region having a side of approximately 25 nm.

Here, each side in each of the orthogonal coordinate systems is dissected. Each of the orthogonal coordinate systems is allocated to the sub layer (or a layer corresponding to each of the plurality of orthogonal coordinate systems), and therefore a pattern superposed on the small region determined in the first coordinate system ((x, y) coordinates) set as a main layer is subjected to the side dissection to obtain dissected sides 4-1 and 4-2 (Step S4).

By the development simulation, a developed pattern is formed in a state that the first to $(n-1)^{th}$ sub layers (or layers corresponding to the plurality of orthogonal coordinate systems) are superposed (Step S5).

It can be determined based on the program whether a line segment to be moved for correction is inside or outside the partial graphic pattern belonging to the other orthogonal coordinate system, or partially superposed. When the line segment is partially superposed, it can be also determined how much the line segment is superposed, although it takes time to execute a calculation process. Therefore, a movable side in the small region is specified according to following rules (Step S6).

Rule (1): If the side is not inside the partial graphic pattern belonging to another orthogonal coordinate system, it is made movable.

Rule (2): If the side is completely inside the graphic pattern belonging to another orthogonal coordinate system, it is made unmovable.

Regarding the following Rules (3)-1 and (3)-2, any one of them is exclusively applied.

Rule (3)-1: When the side is partially inside the graphic pattern belonging to another orthogonal coordinate system, it is fixed to either of a movable pattern or an unmovable pattern (Process 1).

Rule (3)-2: When the side is partially inside the graphic pattern belonging to another orthogonal coordinate system, a corresponding coverage ratio of the side is calculated, and a value of the ratio is compared with a predetermined threshold to determine whether the side is movable or unmovable (Process 2).

A difference between a pattern obtained by the development simulation and a predetermined ideal pattern (typically, an original pattern) is obtained as a shift amount of each of sides, and the shift amount necessary to recover the shifted side to a position of the ideal pattern is obtained as a correction amount. At this time, the side is shifted in a direction orthogonal to a length direction of the side. Accordingly, the shift direction of the side depends on the orthogonal coordinate system to which each of the graphic patterns belongs. The shift direction is determined, and also the shift amount is automatically determined (Step S7).

It is checked whether or not all the calculated shift amounts of sides are within a permissible range (Step S8). At first, it is highly unlikely that all the shift amounts of sides are within the permissible range (Step S8: N), and therefore the sides are sequentially moved so as to minimize the shift amounts (Step S9).

The side is moved on the basis of the shift direction and the shift amount of the side, which are obtained in Step S7, for each of the orthogonal coordinate systems to which the respective graphic patterns belong, i.e., for each of the first to $(n-1)^{th}$ sub layers (layers corresponding to the plurality of orthogonal coordinate systems), and thereby post-shift dissected sides 5-1 and 5-2 are obtained (Step S10). The flow returns to Step S5, and then Steps S5 to S8 are repeated to all the partial graphic patterns.

If all the calculated movement amounts of sides are within the permissible range (Step S8: Y), the flow proceeds to a next step. When a limit is provided on the basis of a loop count, the flow gets out of the loop when the limit is met.

After completion of calculation in the small region (Step S11), a plurality of obtained partial graphic patterns are synthesized. Then, in the small region, an acute-angled portion is formed is detected. The synthesized graphic pattern is corrected by superposing a small patch on the acute-angled portion (Step S12). The patch has a height of an extent not to cause reduction of yield or increase of cost in production or test of an electron beam lithography mask. The small patch is a graphic pattern including an outline and not having an acute angle, and is rectangular in an example of FIG. 2. Since the acute-angled portion is deformed to be filled through development, influence on a pattern after the development is small even if the acute-angled portion is patched. Thus, it is not required to increase accuracy at the time of production of the mask by electron beam lithography, and at the time of test.

In this manner, the OPC in the small region is completed (Step S13). Upon completion of the OPC in the divided small region(s), the calculation is completed. An OPC pattern, which is a result of the OPC application, is outputted as a file in to the storage unit (not shown) (Step S14).

In the first embodiment, a hammer head pattern is selectively added to each of end portions of the partial graphic pattern on the orthogonal coordinate system allocated to the partial graphic patter, according to necessity.

A photo-mask is generated on the basis of the outputted OPC pattern. A resist film is coated on the substrate for forming an element such as a transistor, and is exposed by use of the photo-mask to form a resist pattern. By using the resist pattern as a mask, etching is performed. The above process is repeated and the element is formed.

In this manner, the OPC can be performed with high accuracy even if oblique lines to each other are included, and therefore a semiconductor device approximating its design can be obtained.

Second Embodiment

Figure 3:
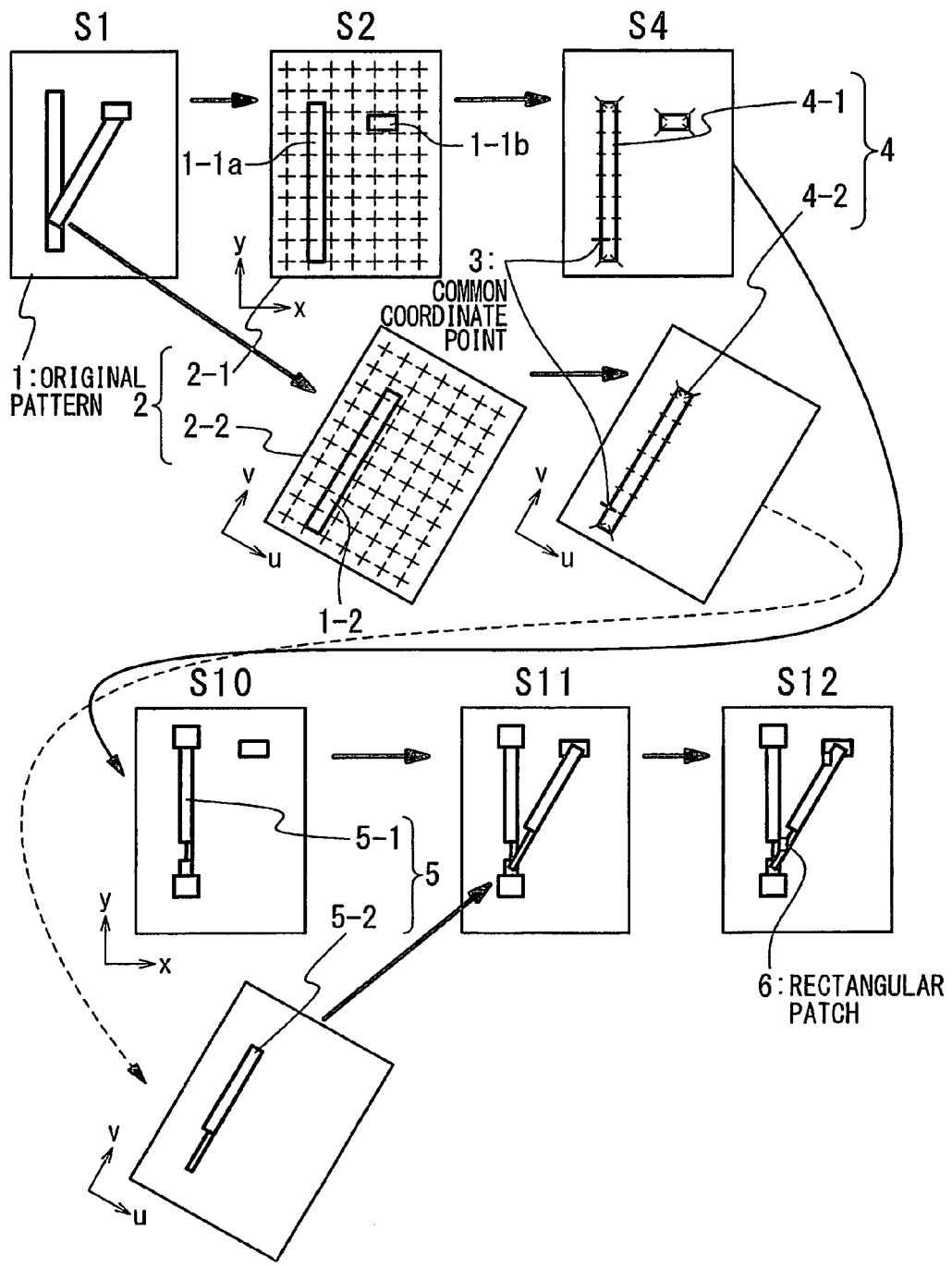
FIG. 3 is a diagram showing the mask designing method in the second embodiment.

The mask production flow according to a second embodiment of the present invention is in common with FIG. 1. Accordingly, description of the mask production flow is the same. Referring to FIG. 3, processing steps different from those in FIG. 2 will be described. In design, for an oblique graphic pattern having two oblique sides in the first coordinate system (x, y), a pattern (hammer head) is first provided to prevent a development pattern in end portions of the partial graphic pattern from receding. The hammer head pattern has a side parallel to any of the coordinate axes of the first orthogonal coordinate system (x, y). After the OPC has been performed, the partial graphic pattern including the end portion on a sub layer is synthesized with the partial graphic pattern including the oblique graphic pattern on a sub layer. Thus, the pattern of the end portion of the oblique pattern disappears, to suppress a reduction in lithography throughput upon production of an electron beam lithography mask. Also, the oblique graphic pattern is divided into small rectangular patterns in production of the mask, and electron beam lithography is performed for each of the small rectangular patterns. Accordingly, a pattern to be corrected (or added) by the OPC is formed from rectangles having sides parallel to any of coordinate axes of the x-y coordinate system, and thereby time saving and cost reduction can be achieved.

Third Embodiment

The mask production flow according to a third embodiment of the present invention is in common to FIG. 1. Accordingly, description of the mask production flow is the same. Referring to FIG. 4, similarly to the third embodiment, a pattern (hammer head) is firstly provided to prevent a development pattern in end portions of the partial graphic pattern from receding. The hammer head pattern is formed of sides parallel to any of coordinate axes of a first orthogonal coordinate system (x, y).

However, in FIG. 4, a width of an oblique graphic pattern is wide, and the end portion protrudes from the hammer head pattern when the oblique rectangle is used without modification. As a conventional case, if the end portion is obliquely cut so as to be accommodated in the hammer head, the present invention cannot be applied.

In order to avoid such a problem, the oblique graphic pattern having a large width is divided into a plurality of rectangles having a small width. The plurality of rectangle regions mutually have steps at end portions thereof such that the end portions do not protrude from the hammer head pattern. An outline of the plurality of rectangle regions is parallel or orthogonal to an outline of the oblique graphic pattern. Accordingly, it is parallel or orthogonal to coordinate axes of an $n^{th}$ orthogonal coordinate system provided to an $n^{th}$ sub layer to which the oblique graphic pattern belongs. A common side of the plurality of rectangle regions is assumed to be unmovable. Thus, the oblique graphic pattern can be entirely allocated to the plurality of orthogonal coordinate systems. In this pattern, an originally acute-angled portion is not formed, so that it is not necessary to finally fill the acute-angled portion with a rectangular patch, and therefore calculation time can be shortened by just that much.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A method of designing a photo-mask, said method comprising:
    dividing a graphic pattern as a target of development simulation into a plurality of sub graphic patterns which respectively correspond to a plurality of orthogonal coordinate systems, as executed by a processing unit on a computer, in which the plurality of orthogonal coordinate systems are not orthogonal to each other; and
    performing a model-based OPC (optical proximity correction) on each of the plurality of sub graphic patterns by moving sides of each of the sub graphic patterns in a direction parallel to coordinate axes of one of the orthogonal coordinate systems that corresponds to said each of the sub graphic patterns.

2. The method according to claim 1, wherein said dividing comprises:
    extracting an extension direction of each of sides of the graphic pattern; and
    dividing the graphic pattern into the plurality of sub graphic patterns, each of which has the sides parallel to the coordinate axes of the one of the orthogonal coordinate systems.

3. The method according to claim 1, further comprising:
    detecting an acute-angled portion between two of sides of a post-correction graphic pattern obtained by synthesizing a plurality of OPC sub graphic patterns after the model-based OPC is performed; and
    correcting the post-correction graphic pattern with a patch pattern for the detected acute-angled portion.

4. The method according to claim 1, further comprising:
    selectively adding a terminal portion to each of end portions of each of a plurality of OPC sub graphic patterns after the model-based OPC is performed on the plurality of sub graphic patterns, such that the terminal portion has parallel sides parallel to the coordinate axes of the one of the orthogonal coordinate systems that corresponds to said each of the sub graphic patterns.

5. The method according to claim 4, further comprising:
    dividing one sub graphic pattern having parallel sides oblique to the coordinate axes of the one of the orthogonal coordinate systems that corresponds to said each of the sub graphic patterns, into a plurality of rectangular patterns such that the OPC is performed on each of the plurality of rectangular patterns.

6. The method according to claim 1, further comprising:
    selectively adding a terminal portion to each of end portions of each of a plurality of OPC sub graphic patterns.

7. The method according to claim 6, wherein said selectively adding the terminal portion is performed after the model-based OPC is performed on the plurality of sub graphic patterns.

8. The method according to claim 1, further comprising:
    dividing one sub graphic pattern having parallel sides oblique to the coordinate axes of the one of the orthogonal coordinate systems that corresponds to said each of the sub graphic patterns into a plurality of patterns.

9. The method according to claim 1, wherein that the OPC is performed on each of the plurality of patterns.

10. The method according to claim 1, wherein each of the plurality of patterns has a rectangular shape.

11. A method of manufacturing a semiconductor device, said method comprising:
    designing a photo-mask to produce photo-mask data;
    producing a photo-mask based on the photo-mask data; and
    manufacturing a semiconductor device by using said photo-mask,
    wherein said designing comprises:
        dividing a graphic pattern as a target of development simulation into a plurality of sub graphic patterns which respectively correspond to a plurality of orthogonal coordinate systems, in which the plurality of orthogonal coordinate systems are not orthogonal to each other; and
        performing a model-based OPC (optical proximity correction) on each of the plurality of sub graphic patterns by moving sides of each of the sub graphic patterns in a direction parallel to coordinate axes of one of the orthogonal coordinate systems that corresponds to said each of the sub graphic patterns.

12. The method according to claim 11, wherein said dividing comprises:
    extracting an extension direction of each of sides of the graphic pattern; and
    dividing the graphic pattern into the plurality of sub graphic patterns, each of which has the sides parallel to the coordinate axes of the one of the orthogonal coordinate systems.

13. The method according to claim 11, wherein said designing further comprises:
    detecting an acute-angled portion between two of sides of a post-correction graphic pattern obtained by synthesizing a plurality of OPC sub graphic patterns after the model-based OPC is performed; and
    correcting the post-correction graphic pattern with a patch pattern for the detected acute-angled portion.

14. The method according to claim 11, wherein said designing further comprises:
    selectively adding a terminal portion to each of end portions of each of a plurality of OPC sub graphic patterns after the model-based OPC is performed on the plurality of sub graphic patterns, such that the terminal portion has parallel sides parallel to the coordinate axes of the one of the orthogonal coordinate systems that corresponds to said each of the sub graphic patterns.

15. The method according to claim 14, wherein said designing further comprises:

dividing one sub graphic pattern having parallel sides oblique to the coordinate axes of the one of the orthogonal coordinate systems that corresponds to said each of the sub graphic patterns, into a plurality of rectangular patterns such that the OPC is performed on each of the plurality of rectangular patterns.

16. A non-transitory computer-readable recording medium in which a computer-readable program is recorded to realize a method of designing a photo-mask, wherein said method comprises:

dividing a graphic pattern as a target of development simulation into a plurality of sub graphic patterns which are respectively assigned with a plurality of orthogonal coordinate systems which are not orthogonal to each other; and performing a model-based OPC (optical proximity correction) on each of the plurality of sub graphic patterns by moving sides of the sub graphic pattern in directions parallel to coordinate axes of the orthogonal coordinate system assigned to the sub graphic pattern.

17. The recording medium according to claim 16, wherein said dividing comprises:

extracting an extension direction of each of sides of the graphic pattern; and dividing the graphic pattern into the plurality of sub graphic patterns, each of which has the sides parallel to the coordinate axes of the one of the orthogonal coordinate systems.

18. The recording medium according to claim 16, wherein said method further comprises:

detecting an acute-angled portion between two of sides of a post-correction graphic pattern obtained by synthesizing a plurality of OPC sub graphic patterns after the model-based OPC is performed; and correcting the post-correction graphic pattern with a patch pattern for the detected acute-angled portion.

19. The recording medium according to claim 16, wherein said method further comprises:

selectively adding a terminal portion to each of end portions of each of a plurality of OPC sub graphic patterns after the model-based OPC is performed on the plurality of sub graphic patterns, such that the terminal portion has parallel sides parallel to the coordinate axes of the one of the orthogonal coordinate systems that corresponds to said each of the sub graphic patterns.

20. The recording medium according to claim 19, wherein said method further comprises:

dividing one sub graphic pattern having parallel sides oblique to the coordinate axes of the one of the orthogonal coordinate systems that corresponds to said each of the sub graphic patterns, into a plurality of rectangular patterns such that the OPC is performed on each of the plurality of rectangular patterns.

* * * * *